(12) United States Patent
Jiang

(10) Patent No.: US 7,061,119 B1
(45) Date of Patent: Jun. 13, 2006

(54) TAPE ATTACHMENT CHIP-ON-BOARD ASSEMBLIES

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/543,034

(22) Filed: Apr. 5, 2000

Related U.S. Application Data

(62) Division of application No. 09/223,059, filed on Dec. 30, 1998, now Pat. No. 6,455,354.

(51) Int. Cl.
  *H01L 23/48* (2006.01)
  *H01L 29/40* (2006.01)
(52) U.S. Cl. .............. 257/777; 257/778; 257/783; 257/784; 257/787; 438/118; 438/124; 438/127; 361/707; 361/708; 361/709; 361/710
(58) Field of Classification Search ........... 257/783, 257/787, 784, 666, 668, 687, 777–778, 790, 257/788, 789; 438/118, 124, 126–127, 15, 438/108; 428/209, 131, 901; 361/707–712, 361/5, 717, 719–723; 174/52.2, 52.4
See application file for complete search history.

(56) References Cited

U.S. PATENT DOCUMENTS

| | | | |
|---|---|---|---|
| 4,363,076 A | 12/1982 | McIver | |
| 4,692,943 A | 9/1987 | Pietzsch et al. | |
| 5,148,266 A * | 9/1992 | Khandros et al. | 357/80 |
| 5,304,842 A | 4/1994 | Farnworth et al. | |
| 5,355,283 A | 10/1994 | Marrs et al. | |
| 5,466,888 A * | 11/1995 | Beng et al. | 174/52.2 |
| 5,536,765 A | 7/1996 | Papathomas | |
| 5,539,251 A | 7/1996 | Iverson et al. | |
| 5,548,091 A | 8/1996 | DiStefano et al. | |
| 5,571,594 A | 11/1996 | Minowa et al. | |
| 5,594,282 A | 1/1997 | Otsuki | |
| 5,600,183 A | 2/1997 | Gates, Jr. | |
| 5,612,569 A * | 3/1997 | Murakami et al. | 257/666 |
| 5,633,529 A | 5/1997 | Otsuki | |
| 5,656,862 A | 8/1997 | Papathomas et al. | |
| 5,659,952 A | 8/1997 | Kovac et al. | |
| 5,668,405 A | 9/1997 | Yamashita | |
| 5,710,071 A | 1/1998 | Beddingfield et al. | |
| 5,733,800 A | 3/1998 | Moden | |
| 5,776,796 A | 7/1998 | Distefano et al. | |
| 5,784,782 A * | 7/1998 | Boyko et al. | 29/848 |
| 5,817,545 A | 10/1998 | Wang et al. | |
| 5,818,698 A | 10/1998 | Corisis | |
| 6,013,946 A * | 1/2000 | Lee et al. | 257/684 |

(Continued)

FOREIGN PATENT DOCUMENTS

EP   0967647 A2   12/1999

(Continued)

*Primary Examiner*—Donghee Kang
(74) *Attorney, Agent, or Firm*—TraskBritt

(57) ABSTRACT

An apparatus and method for preventing damage to tape attachment semiconductor assemblies due to encapsulation filler particles causing damage to a semiconductor die active surface and/or to a corresponding semiconductor substrate surface by providing an adhesive tape which extends across areas of contact between the semiconductor die active surface and the semiconductor substrate. The present invention also includes extending the adhesive tape beyond the areas of contact between the semiconductor die active surface and the semiconductor substrate to provide a visible surface of visual inspection of proper adhesive tape placement.

15 Claims, 19 Drawing Sheets

U.S. PATENT DOCUMENTS

| | | | |
|---|---|---|---|
| 6,017,776 | A | 1/2000 | Jiang et al. |
| 6,048,755 | A | 4/2000 | Jiang et al. |
| 6,049,129 | A * | 4/2000 | Yew et al. .................. 257/737 |
| 6,175,159 | B1 | 1/2001 | Sasaki |
| 6,198,162 | B1 | 3/2001 | Corisis |
| 6,249,052 | B1 | 6/2001 | Lin |
| 6,252,298 | B1 | 6/2001 | Lee et al. |
| 6,326,700 | B1 | 12/2001 | Bai et al. |
| 6,331,453 | B1 | 12/2001 | Bolken et al. |

FOREIGN PATENT DOCUMENTS

| | | |
|---|---|---|
| JP | 9-92775 | 4/1997 |
| WO | 97/01865 | 1/1997 |
| WO | WO97/01865 * | 1/1997 |

* cited by examiner

TAPE ATTACHMENT CHIP-ON-BOARD ASSEMBLIES

CROSS REFERENCE TO RELATED APPLICATION

This application is a divisional of application Ser. No. 09/223,059, filed Dec. 30, 1998, now U.S. Pat. No. 6,455,354, issued Sep. 24, 2002.

BACKGROUND OF THE INVENTION

1. Field of the Invention

The present invention relates to a "chip-on-board" (COB) semiconductor assembly and, more particularly, to a method and apparatus for reducing stress resulting from lodging of filler particles present in encapsulant and glob top materials between a surface of a semiconductor die and a corresponding surface of a semiconductor substrate and for visual inspection of the attachment of the semiconductor die to the semiconductor substrate with the use of tape attachment material.

2. State of the Art

Definitions: The following terms and acronyms will be used throughout the application and are defined as follows:

COB—Chip-On-Board: The techniques used to attach a semiconductor die to a semiconductor substrate, such as a printed circuit board.

Glob Top: A glob of encapsulant material (usually epoxy or silicone or a combination thereof) surrounding a semiconductor die or portion thereof in a COB assembly.

Wire Bonding: Conductive wires attached between a semiconductor die and a circuit board or leadframe to form an electrical connection therebetween.

TAB—Tape Automated Bonding: Conductive traces are formed on a dielectric film such as a polyimide (the structure also being termed a "flex circuit"), and the film is precisely placed to electrically connect a semiconductor die and a circuit board or leadframe through the conductive traces. Multiple connections are simultaneously effected.

FIGS. 14 and 15 illustrate exemplary COB assemblies 200 each comprising a semiconductor die 202 back-bonded with an adhesive layer 204 to a semiconductor substrate 206. The semiconductor die 202 is in electrical communication with the semiconductor substrate 206 through electrical elements extending between bond pads 208 on the semiconductor die 202 and traces 212 on the semiconductor substrate 206. The electrical elements are generally bond wires 214, as illustrated in FIG. 14, or TAB connections 216, as illustrated in FIG. 15.

In wire bonding, as illustrated in FIG. 14, a plurality of bond wires 214 is attached, one at a time, to each bond pad 208 on the semiconductor die 202 and extends to a corresponding lead or trace 212 on the semiconductor substrate 206. The bond wires are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts.

With TAB, as illustrated in FIG. 15, TAB connectors 216 (generally metal leads carried on an insulating tape, such as a polyimide) are attached to each bond pad 208 on the semiconductor die 202 and to a corresponding lead or trace 212 on the semiconductor substrate 206.

An encapsulant 218, such as a plastic resin, is generally used to cover the bond wires 214 (FIG. 14) and TAB connectors 216 (FIG. 15) to prevent contamination, aid mechanical attachment of the assembly components, and increase long-term reliability of the electronics with reasonably low-cost materials.

An exemplary technique of forming the encapsulant 218 is molding and, more specifically, transfer molding. In the transfer molding process (and with specific reference to COB die assemblies), after the semiconductor die 202 is attached to the semiconductor substrate 206 (e.g., FR-4 printed circuit board) and electrical connections made (by wire bonding or TAB) to form a die assembly, the die assembly is placed in a mold cavity in a transfer molding machine. The die assembly is thereafter encapsulated in a thermosetting polymer which, when heated, reacts irreversibly to form a highly cross-linked matrix no longer capable of being re-melted. Additionally, another common manner of forming encapsulants for COB assemblages is "glob top" polymeric encapsulation. Glob top encapsulation can be applied by dispensing suitably degassed material from a reservoir through a needle-like nozzle onto the die assembly.

The thermosetting polymer of transfer molding generally is comprised of three major components: an epoxy resin, a hardener (including accelerators), and a filler material. Other additives such as flame retardants, mold release agents and colorants are also employed in relatively small amounts. Furthermore, glob top encapsulation can comprise a non-linear thixotropic material that also includes fillers to achieve the desired degree of thixotropy.

While many variations of the three major components are known in the art, the present invention focuses on the filler materials employed and their effects on the active semiconductor die surfaces and corresponding semiconductor substrate surfaces.

Filler materials are usually a form of fused silica, although other materials such as calcium carbonates, calcium silicates, talc, mica and clays have been employed for less rigorous applications. Powdered fused quartz is currently the primary filler used in encapsulants. Fillers provide a number of advantages in comparison to unfilled encapsulants. For example, fillers reinforce the polymer and thus provide additional package strength, enhance thermal conductivity of the package, provide enhanced resistance to thermal shock, and greatly reduce the cost of the polymer in comparison to its unfilled state. Fillers also beneficially reduce the coefficient of thermal expansion (CTE) of the composite material by about fifty percent in comparison to the unfilled polymer, resulting in a CTE much closer to that of the silicon or gallium arsenide die. Filler materials, however, also present some recognized disadvantages, including increasing the stiffness of the plastic package, as well as the moisture permeability of the package.

Two problems encountered in transfer molding are bond wire sweep and connection detachment. Bond wire sweep occurs in wire bonded packages wherein the encapsulant material, which is injected into the mold under pressure, deforms the bond wires which can cause shorting. Connection detachment can occur in either TAB connections 216 or bond wires 214, wherein stresses created by the pressurized encapsulant material result in the detachment of the TAB connections 216 or bond wires 214 from either the bond pad 208 or the trace 212.

To alleviate this problem and to reduce the thickness of the semiconductor assembly, as illustrated in FIG. 16, a technique of face-down attachment of a semiconductor die 232 onto a semiconductor substrate 234 with an adhesive tape 236 has been developed. With this technique, the semiconductor substrate 234 has an opening 238 therethrough with electrical connections 240 (shown as bond wires) extending through the opening 238 to connect the bond pads 242 on an active surface 262 of the semiconductor die 232 to the traces 244 on an active surface 250 of the semiconductor substrate 234. The adhesive tape 236 used in these assemblies is generally narrow and does not extend to an edge 246 of the semiconductor die 232, resulting in exterior voids 248, and does not extend to an edge 252 of the opening 238, resulting in interior voids 254. The opening 238 is filled and the electrical connections 240 are covered with a glob top material 256 injected into the opening 238, as shown in FIG. 17. Thus, the electrical connections 240 are protected from bond wire sweep and connection detachment. As shown in FIG. 18, an encapsulant material 258 is molded over the semiconductor die 232.

Unfortunately, a significant disadvantage of using glob top materials and encapsulant materials having filler particles is the potential for damage to the active surface 262 of the semiconductor die 232 and/or a back surface 264 of the semiconductor substrate 234 resulting from the lodging or wedging of filler particles 266 between the semiconductor die active surface 262 and the semiconductor substrate back surface 264, as shown in FIGS. 19 and 20.

As shown in FIG. 19, which is an enlarged view of the inset 19 of FIG. 17, if filler particles 266 are used in the glob top material 256, the filler particles 266 may be jammed between the semiconductor die active surface 262 and the semiconductor substrate back surface 264 within the interior void 254. Furthermore, as shown in FIG. 20, which is an enlarged view of the inset 20 of FIG. 18, if filler particles 266 are used in the encapsulant material 258, the filler particles 266 may also be jammed between the semiconductor die active surface 262 and the semiconductor substrate back surface 264 within the exterior void 248 due to non-uniform polymer flow patterns and flow imbalances of the encapsulant material 258 in the mold cavity during transfer molding. The jammed filler particles 266 place the semiconductor die active surface 262 and the semiconductor substrate back surface 264 under residual stress at the points of contact with the jammed filler particles 266. The particles may then damage or crack the semiconductor die active surface 262 and/or the semiconductor back surface 264 when the assembly is stressed (i.e., mechanically, thermally, electrically, etc.) during post-encapsulation handling and testing. This damage can result in failure of the semiconductor assembly, alteration of the performance characteristics, and/or, if the damage is not immediately detected, unanticipated shortening of device life.

While it is possible to employ a lower volume of filler particles 266 in the encapsulant material 258 to reduce the potential for the filler particles 266 lodging or wedging, a drastic reduction in filler volume raises costs of the polymer to unacceptable levels. Additionally, while the size of the filler particles 266 may be reduced to reduce the potential for the filler particles 266 lodging or wedging, currently available filler technology imposes certain limitations as to practical beneficial reductions in particle size and in the shape of the filler particles 266. Furthermore, while it is desirable that filler particles 266 be of generally spherical shape, it has thus far proven impossible to eliminate nonspherical flakes or chips which when jammed between the semiconductor die active surface 262 and the semiconductor back surface 264 are more prone to damage the semiconductor die active surface 262 and/or the semiconductor back surface 264. Moreover, an underfilling could be used to seal the interior voids 254 and the exterior voids 248. However, such underfilling would be prohibitively expensive.

The problem of semiconductor assembly damage due to jammed filler particles 266 in association with assembly stressing (i.e., mechanically, thermally, electrically, etc.) during post-encapsulation handling and testing will continue to worsen as ongoing advances in design and manufacturing technology provide increasingly thinner conductive, semiconductive, and dielectric layers. The resulting semiconductor assemblies will be more susceptible to stressing due to the minimal strength provided by the minute widths, depths and spacings of the constituent elements of the semiconductor assemblies. Thus, with increasing stress susceptibility, the semiconductor assemblies are more prone to damage from jammed filler particles 266.

In addition to solving the problems associated with filler particle 266 lodging and damage, it is desirable to improve the ability to visually inspect for proper attachment of the semiconductor die 232 to the semiconductor substrate 234 (i.e., inspect for misaligned or missing adhesive tape 236). Prior art COB die assemblies have been unsuccessful, not only in preventing damage due to the filler particles 266, as explained above, but also in providing an eye point for enhanced visual inspection (generally by a computerized optical detection apparatus) of the proper attachment of the semiconductor die 232 to the semiconductor substrate 234 prior to encapsulation.

This lack of proper inspection is generally due to the use of narrow adhesive tape 236 which does not extend to an edge 246 of the semiconductor die 232, nor to an edge 252 of the opening 238, as shown in FIGS. 14–18 and as discussed above. The use of such narrow adhesive tape 236 makes visual inspection of the proper tape attachment extremely difficult, because inspection must be made by looking longitudinally between the semiconductor die 232 and the semiconductor substrate 234 along the respective attachment surfaces where spacing is microscopic. Visual inspection cannot be made looking vertically either (i.e., looking upward through the opening 238 or downward at the semiconductor substrate back surface 264) because the adhesive tape 236 is enclosed between the semiconductor die 232 and the semiconductor substrate 234. Furthermore, the use of narrow adhesive tape 236 also limits the contact surface area available for semiconductor die 232 to semiconductor substrate 234 adhesion and attachment.

Furthermore, it is desirable to increase or enhance the stability of the semiconductor assembly in order to reduce or eliminate localized stress failures occurring during encapsulation. These failures can cause subsequent cracking. Semiconductor assembly stability, in the past, has been approached from the perspective of improving adhesives employed with carrier films, rather than by sealing the gaps or spaces between the semiconductor substrate and the semiconductor die.

U.S. Pat. No. 5,733,800 issued Mar. 31, 1998 to Moden ("the Moden patent") discloses a "leads over chip" (LOC) die assembly, wherein a seal between a leadframe and a die is created by underfill material introduced into and extending between the bonding location of the die and the edge of the die. However, the Moden patent relates to an LOC assemblage which utilizes a narrow tape segment and requires the added expense of introducing underfill material in between the leadframe and the semiconductor die in order to seal the gap or space proximate the tape segment. In addition, the use of LOC assemblages, as in the Moden patent, does not create the type of visual inspection problems discussed above and inherent in COB assemblages because tape segments can be viewed when looking between leads of the leadframe.

Additionally, U.S. Pat. No. 5,466,888 issued Nov. 14, 1995 to Beng et al. ("the Beng patent") discloses a LOC semiconductor device utilizing an electrically insulating film interposed between the leads and the chip for strengthening adherence of the film to packaging material and to the chip. However, as with the Moden patent, the Beng patent relates to a LOC assemblage.

From the foregoing, the prior art has neither provided for visual die assembly inspection, nor recognized the stress phenomenon associated with encapsulant materials having filler particles with COB assemblies. Thus, it can be appreciated that it would be advantageous to develop a semiconductor assembly and a technique to fabricate the same which eliminate potential damage due to filler particles and allow for pre-encapsulation semiconductor die to semiconductor substrate attachment and sealing visual inspection.

SUMMARY OF THE INVENTION

The present invention relates to an apparatus and a method for preventing damage to a semiconductor assembly due to encapsulation filler particles causing damage to the semiconductor die active surface and/or to a corresponding substrate surface. The present invention also provides a semiconductor assembly which allows for visual inspection of the semiconductor die to semiconductor substrate attachment.

One embodiment of the present invention comprises a semiconductor die assembly including a semiconductor substrate having an opening defined therethrough and a semiconductor die having a plurality of electrical connection areas, such as bond pads and hereinafter referred to as "bond pads," on an active surface thereof. The semiconductor die is attached to the semiconductor substrate such that the bond pads are aligned with the semiconductor substrate opening. The semiconductor die is attached to the semiconductor substrate with an adhesive tape which preferably extends proximate an edge of the semiconductor die and proximate an edge of the semiconductor substrate opening. Such an adhesive tape configuration maximizes the contact area between the semiconductor die and the semiconductor substrate. This increased contact area assists in preventing the semiconductor die from flexing, twisting, or bending away from the semiconductor substrate, thus reducing or eliminating localized stress failures occurring during subsequent molding processes.

Electrical connections are then attached between the semiconductor die bond pads and traces on an active surface of the semiconductor substrate through the semiconductor substrate opening. The semiconductor substrate opening is filled and the electrical connections are covered with a glob top material injected into the opening. The adhesive tape extending proximate the semiconductor substrate opening edge substantially prevents glob top material from residing between the semiconductor die active surface and the semiconductor substrate back surface, thereby virtually eliminating previously discussed problems associated with filler particles used in the glob top material.

An encapsulant material is molded over the semiconductor die and the glob top material. Again, the adhesive tape extending proximate the semiconductor die edge substantially prevents encapsulant material from residing between the semiconductor die active surface and the semiconductor substrate back surface, thereby eliminating previously discussed problems associated with filler particles used in the encapsulant material.

In another embodiment of the present invention, the adhesive tape is extended past the semiconductor substrate opening edge to provide a detectable surface within the semiconductor substrate opening. The adhesive tape detectable surface can be visually detected through the semiconductor substrate opening. Thus, a visual inspection system may be used to detect the presence and/or misalignment of the adhesive tape. Thus, a conductive tape can be sized and configured both to prevent filler particle lodging and to allow for visual detection of the presence and/or misalignment of the adhesive tape. It is, of course, understood that the adhesive tape may also extend past the semiconductor die edge.

In another embodiment of the present invention, the adhesive tape includes a carrier film which carries the first adhesive layer on a first planar surface of the carrier film and a second adhesive layer on a second planar surface of the carrier film. The first adhesive layer and the second adhesive layer are preferably different adhesives. The use of differing adhesives compensates for the disparity in thermal expansion values typically existing between semiconductor substrates and semiconductor dice. For example, the first adhesive layer may be used to attach the carrier film to the semiconductor die active surface, wherein the first adhesive layer would be selected to accommodate the coefficient of thermal expansion (CTE), adhesion, and modulus properties of the semiconductor die. The second adhesive layer may be used to attach the carrier film to the semiconductor substrate back surface, wherein the second adhesive layer would be selected to accommodate the CTE, adhesion, and modulus properties of the semiconductor substrate. Additionally, the adhesive tape may include only the first adhesive layer laminated with the second adhesive layer without the use of a carrier film. Such a configuration is acceptable so long as the configuration prevents filler particle penetration, as described above. Furthermore, the first adhesive layer and the second adhesive layer could be of varying thicknesses as needed or required for a specific semiconductor assembly.

Additionally, at least one fillet can be created at the junction between an adhesive layer and the semiconductor die active surface and/or the semiconductor substrate. Filleting of the adhesive layers is caused by flow of the material in the adhesive layers during attachment of the semiconductor die to the semiconductor substrate by processes known in the art, such as heating processes, which causes the adhesive layers to momentarily flow out from the space between the semiconductor die and the carrier film and out from the space between the carrier film and the semiconductor substrate, and thereafter solidify. The degree of filleting can be manipulated by varying the thickness of the adhesive layers. Such filleting of the adhesive layers accords additional protection against the possibility of filler particles lodging or wedging between the adhesive layers and the semiconductor die and/or the semiconductor substrate.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

FIGS. 1–13 illustrate various views of semiconductor assemblies according to the present invention. It should be understood that the illustrations are not meant to be actual views of any particular semiconductor assembly, but are merely idealized representations which are employed to more clearly and fully depict the present invention than would otherwise be possible. Additionally, elements common between FIGS. 1–13 retain the same numerical designation.

Figure 1:
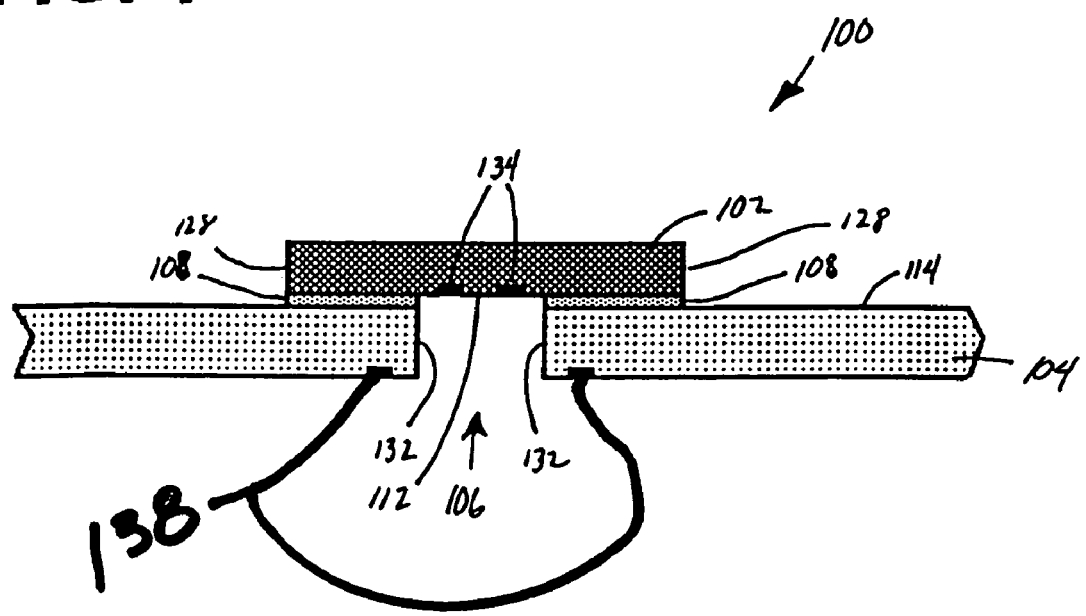
FIG. 1 is a cross-sectional side view of an intermediate semiconductor assembly of the present invention.

FIG. 1 illustrates an embodiment of an intermediate semiconductor die assembly 100 according to the present invention, wherein a semiconductor die 102, such as those known in the art, extends over and is attached to a semiconductor substrate 104 having an opening 106 defined therein. The semiconductor substrate 104 can be an FR-4 printed circuit board, a ceramic substrate or other known substrates including multiple layered substrates. In addition, the present invention is not intended to be limited to the use of one substrate per die assembly.

For purposes of illustration, the semiconductor die 102 can comprise memory devices, such as dynamic random access memory (DRAM) and static random access memory (SRAM), and other semiconductor devices wherein COB assemblies are used.

Figure 2:
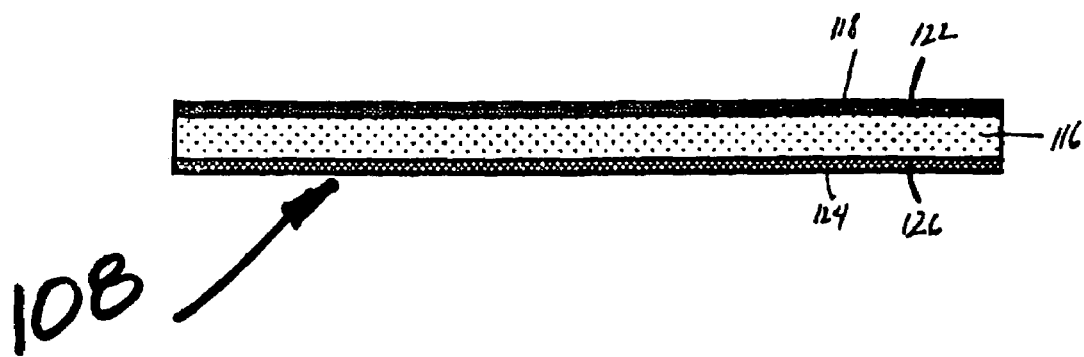
FIG. 2 is a cross-sectional side view of an adhesive tape material according to the present invention.

Adhesive tape 108 is positioned between the semiconductor die 102 and the semiconductor substrate 104 on opposing sides of the semiconductor substrate opening 106, thereby attaching an active surface 112 of the semiconductor die 102 to a back surface 114 of the semiconductor substrate 104. The adhesive tape 108 is preferably a planar dielectric or insulative carrier film 116 having a first adhesive layer 118 on a first planar surface 122 of the carrier film 116 and a second adhesive layer 124 on a second planar surface 126 of the carrier film 116, as shown in FIG. 2.

Referring back to FIG. 1, the adhesive tape 108 (shown generally as a width) preferably extends proximate an edge 128 of the semiconductor die 102 and proximate an edge 132 of the semiconductor substrate opening 106. Such a configuration of the adhesive tape 108 maximizes the contact area between the semiconductor die 102 and the semiconductor substrate 104. This increased contact area assists in preventing the semiconductor die 102 from flexing, twisting, or bending away from the semiconductor substrate 104, thus reducing or eliminating localized stress failures occurring during subsequent molding processes.

Figure 3:
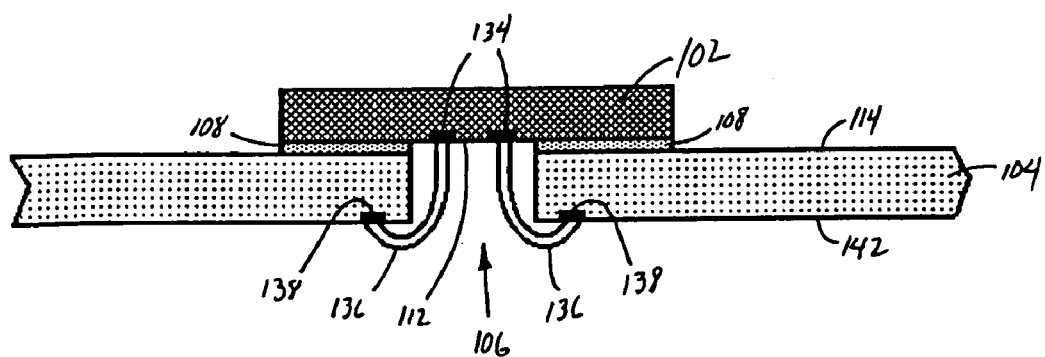
FIG. 3 is a cross-sectional side view of an intermediate semiconductor assembly including bond wire connections according to the present invention.
Figure 4:
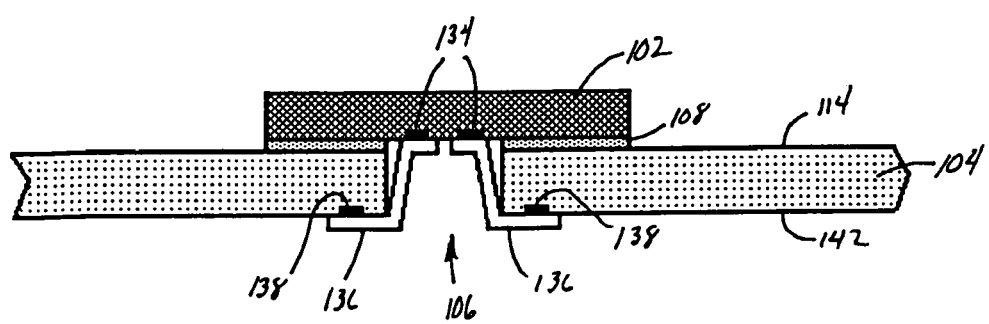
FIG. 4 is a cross-sectional side view of an intermediate semiconductor assembly including TAB connections according to the present invention.

The semiconductor die active surface 112 is aligned such that at least one bond pad 134 is aligned with the semiconductor substrate opening 106. As shown in FIGS. 3 and 4, electrical connections 136 (shown as bond wires in FIG. 3 and TAB connections in FIG. 4) are then attached between the semiconductor die bond pads 134 and traces 138 (which are in electrical communication with electrical components either internal or external to the semiconductor substrate 104) on an active surface 142 of the semiconductor substrate 104 through the semiconductor substrate opening 106.

Figure 5:
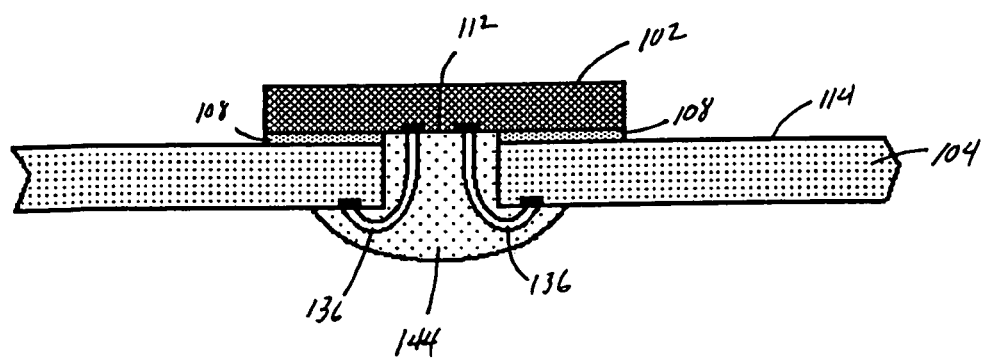
FIG. 5 is a cross-sectional side view of an intermediate semiconductor assembly including a glob top encapsulation according to the present invention.

The semiconductor substrate opening 106 is filled and the electrical connections 136 are covered with a glob top material 144 injected into the opening 106, as shown in FIG. 5. The adhesive tape 108 extending proximate the semiconductor substrate opening edge 132 substantially prevents glob top material 144 from residing between semiconductor die active surface 112 and the semiconductor substrate back surface 114, thereby virtually eliminating problems associated with filler particles used in the glob top material 144. Thus, the electrical connections 136 are protected from bond wire sweep and connection detachment by the glob top material 144.

Figure 6:
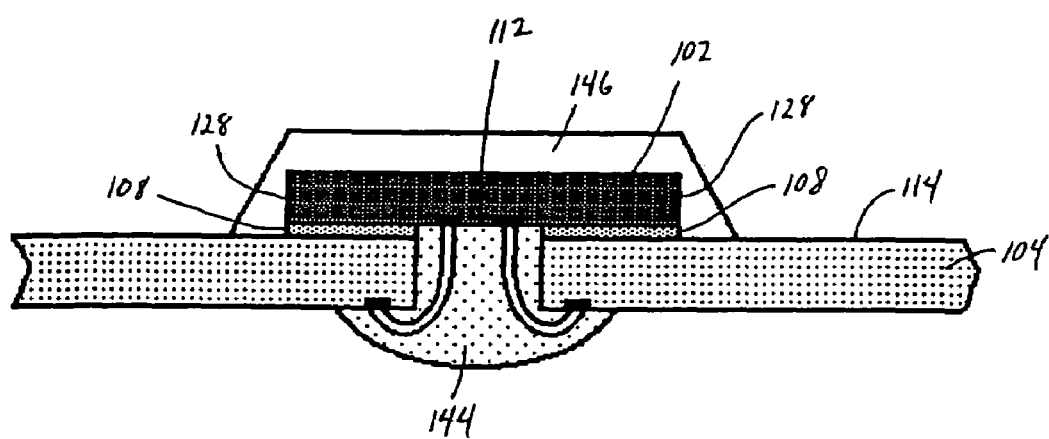
FIG. 6 is a cross-sectional side view of a semiconductor assembly shielded by an encapsulation material according to the present invention.

As shown in FIG. 6, an encapsulant material 146 is molded over the semiconductor die 102. It is, of course, understood that the encapsulant material 146 could be a glob top material applied over the semiconductor die 102 and that the encapsulant material could also be molded to encase the glob top material 144. Again, the adhesive tape 108 extending proximate the semiconductor die edge 128 substantially prevents encapsulant material 146 from residing between semiconductor die active surface 112 and the semiconductor substrate back surface 114, thereby eliminating problems associated with filler particles used in the encapsulant material 146.

Figure 7:
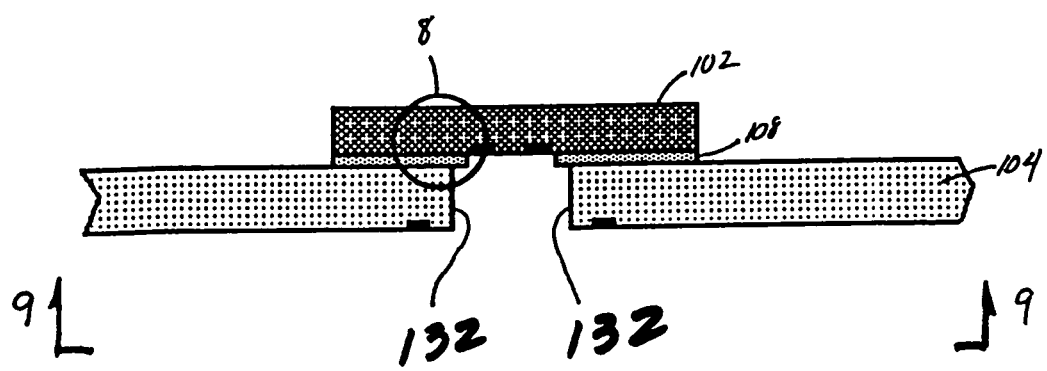
FIG. 7 is a cross-sectional side view of an intermediate semiconductor assembly including an extended adhesive tape according to the present invention.
Figure 8:
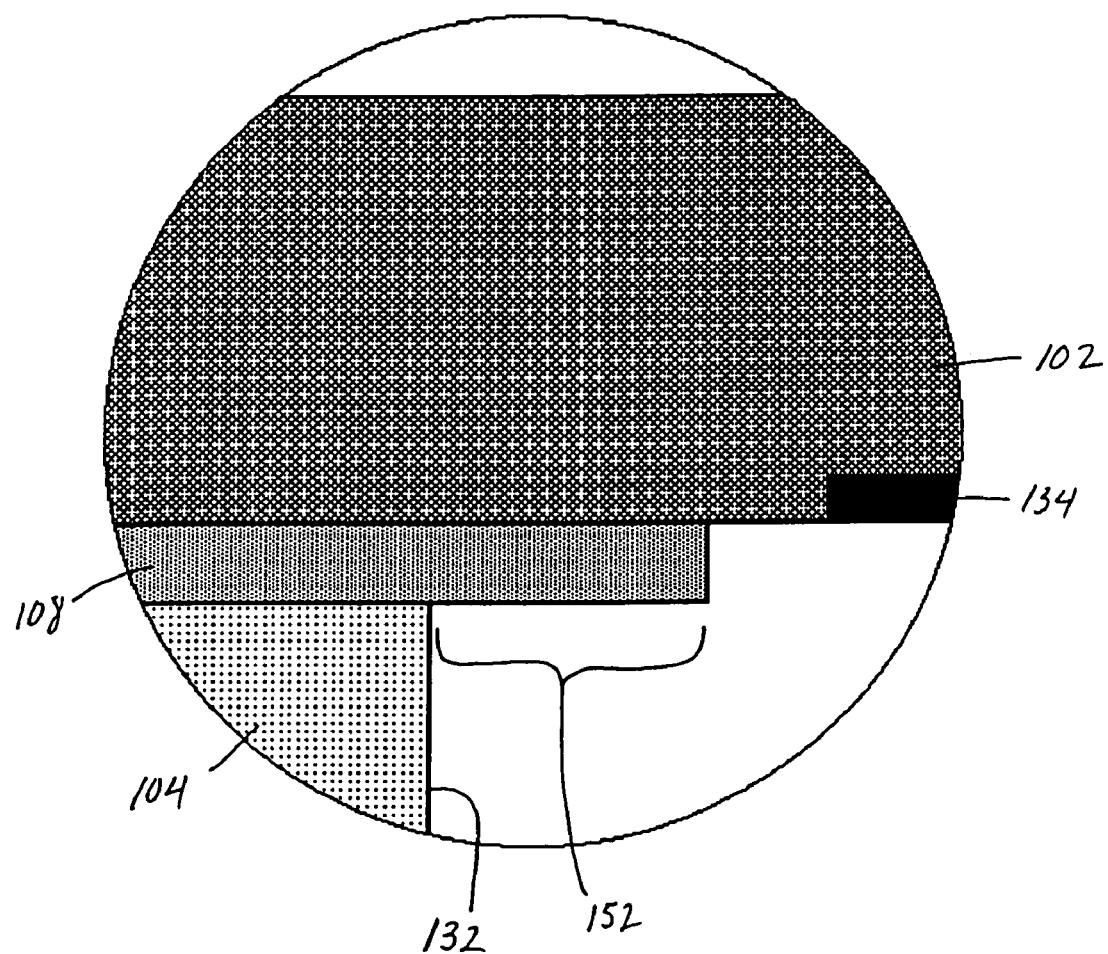
FIG. 8 is a cross-sectional side view of inset 8 of FIG. 7 according to the present invention.
Figure 9:
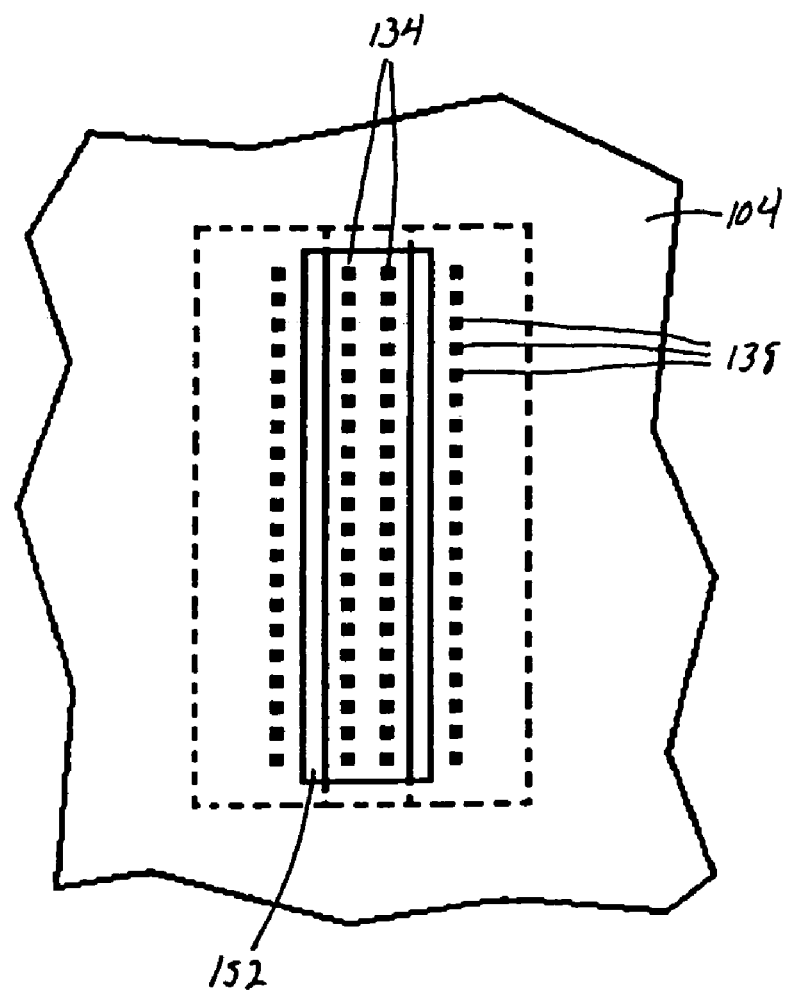
FIG. 9 is a bottom plan view along line 9—9 of FIG. 7 of an intermediate semiconductor assembly according to the present invention.
Figure 10:
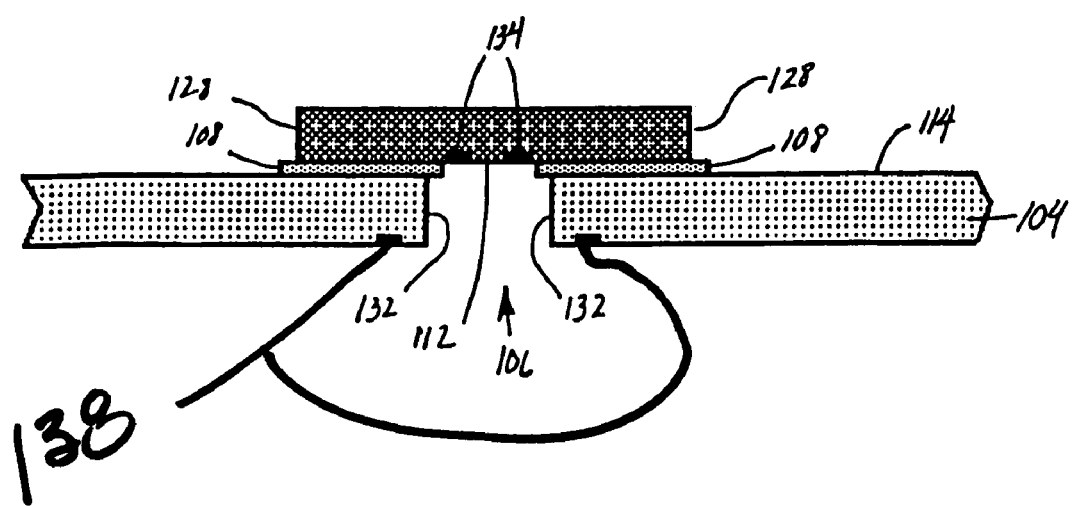
FIG. 10 is a cross-sectional side view of another intermediate semiconductor assembly including an extended adhesive tape according to the present invention.

In another embodiment of the present invention, the adhesive tape 108 is extended past the semiconductor substrate opening edge 132, as shown in FIG. 7, to provide a detectable surface 152 within the semiconductor substrate opening 106, as shown in FIG. 8 (an enlargement of inset 8 of FIG. 7). As shown in FIG. 9 (a view along line 9—9 of FIG. 7), the adhesive tape detectable surface 152 can be visually detected through the semiconductor substrate opening 106. Thus, a visual inspection system may then be used to detect the presence and/or misalignment of the adhesive tape 108. Thus, an adhesive tape 108 can be sized and configured both to prevent filler particle lodging, described above, and to allow for visual detection of the presence and/or misalignment of the adhesive tape 108. It is, of course, understood that the adhesive tape 108 may also extend past the semiconductor die edge 128, as shown in FIG. 10, with visual inspection being conducted viewing the semiconductor substrate back surface 114.

Referring to FIG. 2, an embodiment of the adhesive tape 108 includes the carrier film 116, such as Upilex® (UBE Industries, Ltd., Ube City, Japan), Kapton® (E.I. du Pont de Nemours and Co., Midland, Mich., USA), or other such films, which carries the first adhesive layer 118 on a first planar surface 122 of the carrier film 116 and a second adhesive layer 124 on a second planar surface 126 of the carrier film 116. The first adhesive layer 118 and the second adhesive layer 124 are preferably different adhesives. The use of differing adhesives compensates for the disparity in thermal expansion values typically existing between semiconductor substrates and semiconductor dice. For example, the first adhesive layer 118 may be used to attach the carrier film 116 to the semiconductor die active surface 112, wherein the first adhesive layer 118 would be selected to accommodate the coefficient of thermal expansion (CTE), adhesion, and modulus properties of the semiconductor die 102, such as a high Tg thermoplastic adhesive. The second adhesive layer 124 may be used to attach the carrier film 116 to the semiconductor substrate back surface 114, wherein the second adhesive layer 124 would be selected to accommodate the CTE, adhesion, and modulus properties of semiconductor substrate 104, such as a low Tg thermoset adhesive. Additionally, the adhesive tape 108 may include only the first adhesive layer 118 laminated with the second adhesive layer 124 without the use of a carrier film (not shown) by processes known in the art. Such a configuration is acceptable so long as the configuration prevents filler particle penetration, as described above. Furthermore, the first adhesive layer 118 and the second adhesive layer 124 could be of varying thicknesses as needed or required for a specific semiconductor assembly. Preferably, the overall adhesive tape thickness is between about 80 and 200 µm so as to electrically insulate and attach the semiconductor die 102 to the semiconductor substrate 104.

Figure 11:
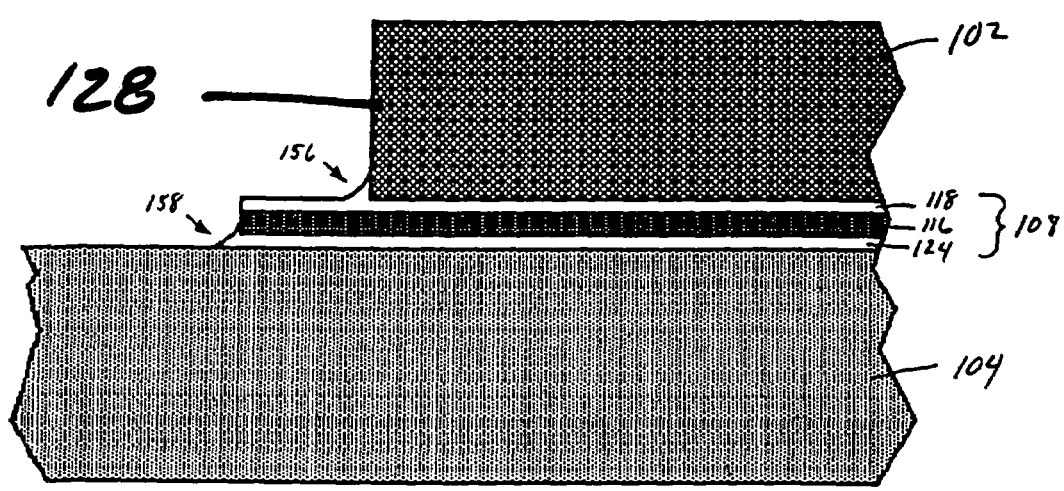
FIG. 11 is a cross-sectional side view of an embodiment of filleting of the adhesive layers according to the present invention.
Figure 12:
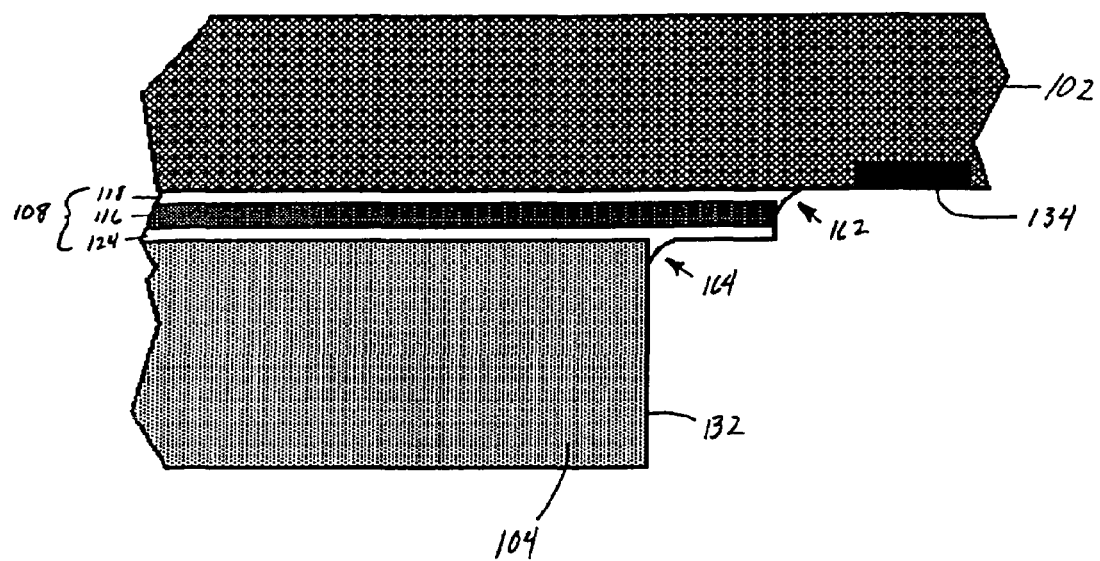
FIG. 12 is a cross-sectional side view of another embodiment of filleting of the adhesive layers according to the present invention.
Figure 13:
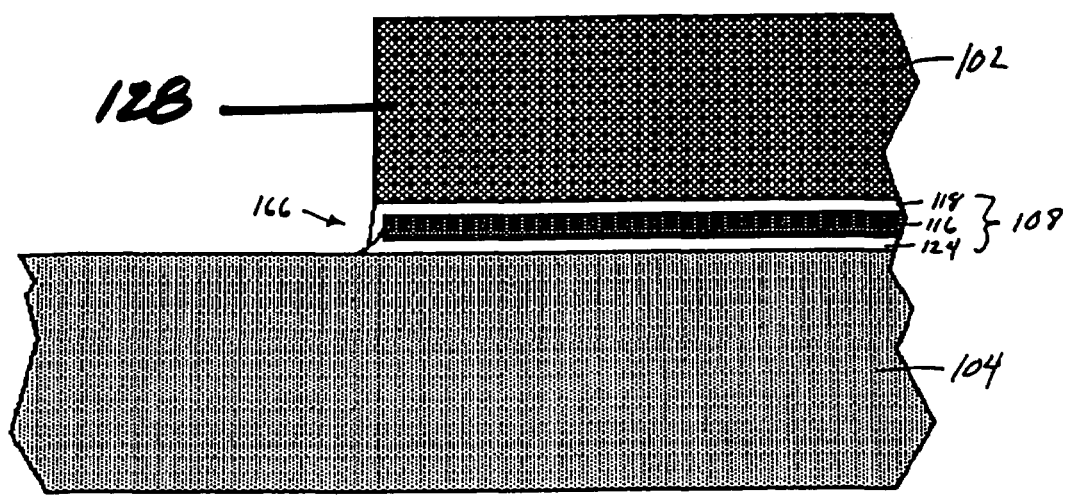
FIG. 13 is a cross-sectional side view of yet another embodiment of filleting of the adhesive layers according to the present invention.
Figure 14:
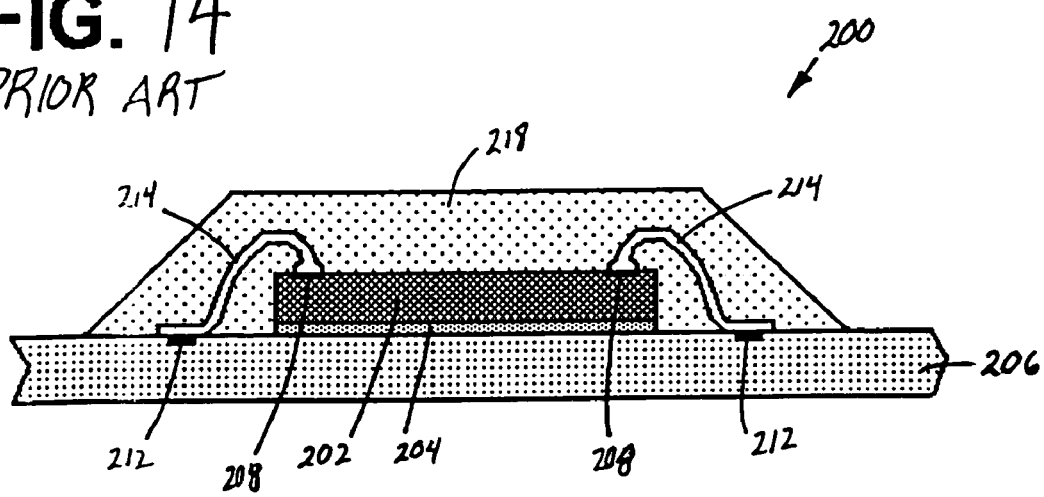
FIGS. 14 and 15 are cross-sectional side views of prior art back bonded semiconductor assemblies.
Figure 15:
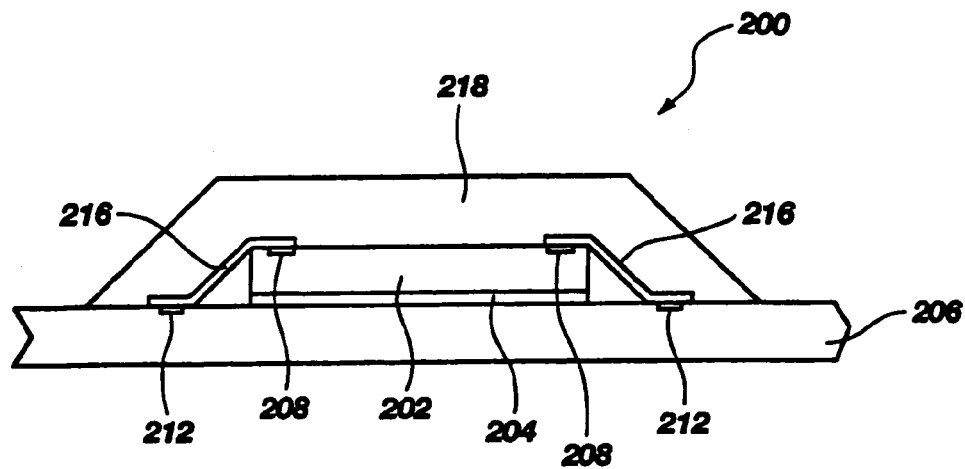
Figure 16:
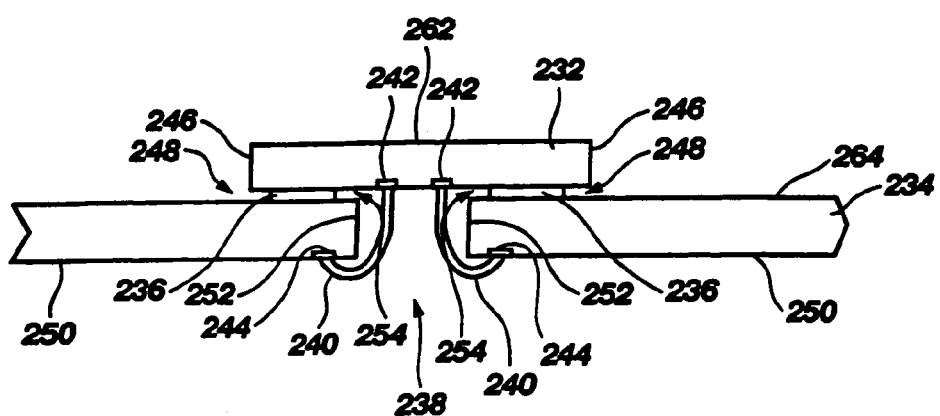
FIG. 16 is a cross-sectional side view of a prior art intermediate semiconductor assembly.
Figure 17:
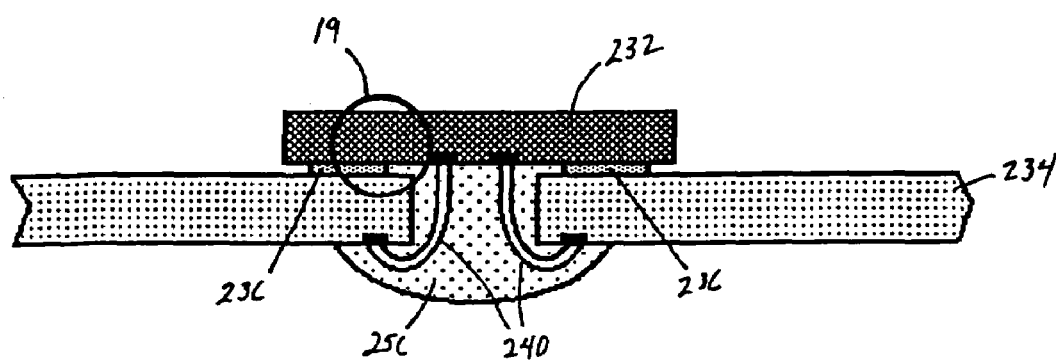
FIG. 17 is a cross-sectional side view of the prior art intermediate semiconductor assembly of FIG. 16 having a glob top encapsulation.
Figure 18:
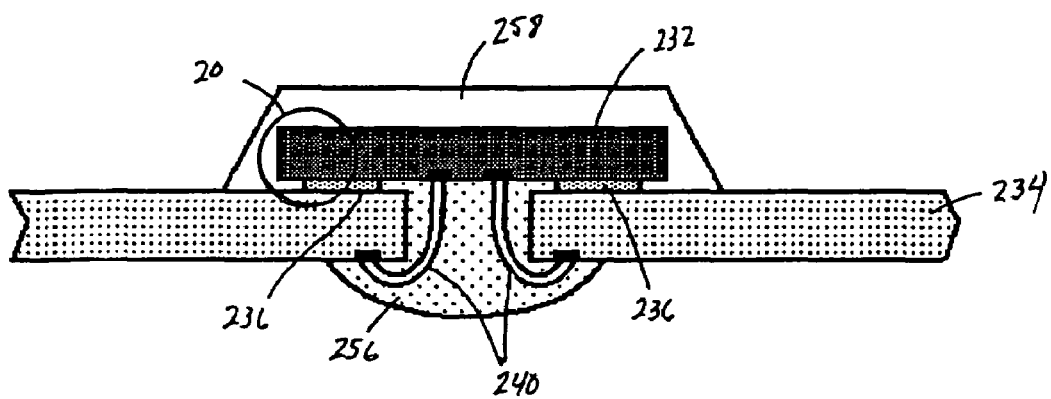
FIG. 18 is a cross-sectional side view of the prior art intermediate semiconductor assembly of FIG. 17 shielded by an encapsulation material.
Figure 19:
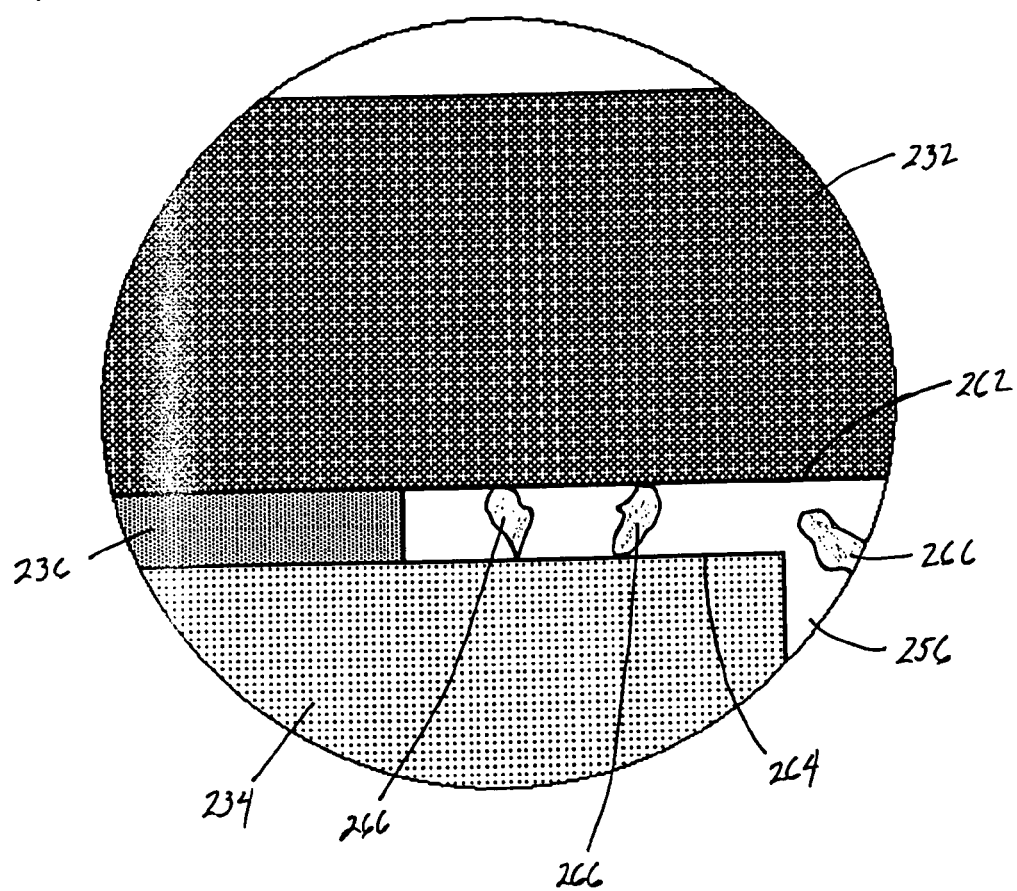
FIG. 19 is a cross-sectional side view of inset 19 of FIG. 17.
Figure 20:
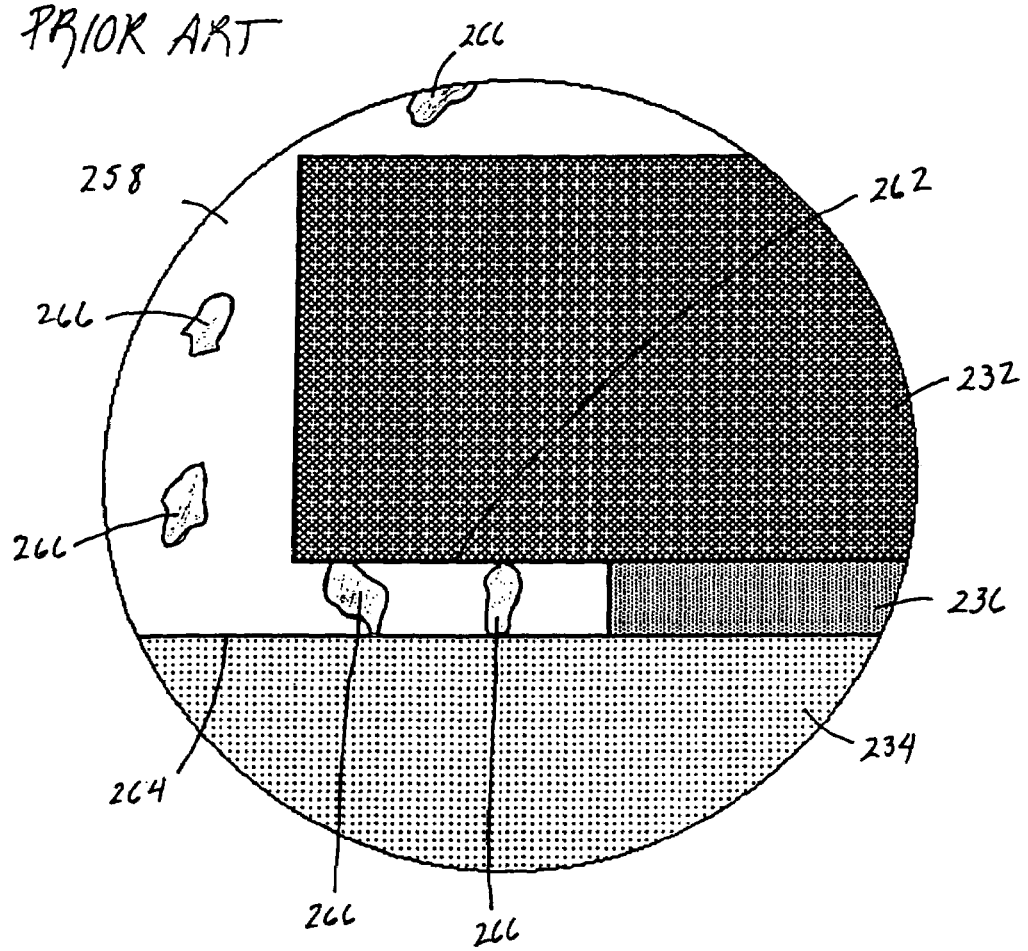
FIG. 20 is a cross-sectional side view of inset 20 of FIG. 18.

Additionally, at least one fillet can be created at the junction between an adhesive layer and the semiconductor die active surface 112 and/or the semiconductor substrate 104. FIG. 11 illustrates the adhesive tape 108 extending past the semiconductor die edge 128, wherein a first fillet 156 is formed from the first adhesive layer 118 and a second fillet 158 is formed from the second adhesive layer 124. FIG. 12 illustrates the adhesive tape 108 extending past the semiconductor substrate opening edge 132, wherein a third fillet 162 is formed from the first adhesive layer 118 and a fourth fillet 164 is formed from the second adhesive layer 124. FIG. 13 illustrates the adhesive tape 108 extending just short of the semiconductor die edge 128 due to a slight misalignment of the adhesive tape, wherein a fillet 166 composed of a portion of the first adhesive layer 118 and a portion of the second adhesive layer 124 is formed. Such a fillet formation can compensate for slight adhesive tape 108 misalignments by filling any potential voids between the semiconductor die 102 and the semiconductor substrate 104.

Filleting of the adhesive layers is caused by flow of the material in the adhesive layers during attachment of the semiconductor die 102 to the semiconductor substrate 104 by processes known in the art, such as heating processes, which cause the adhesive layers 118, 124 to momentarily flow out from the space between the semiconductor die 102 and the carrier film 116 and out from the space between the carrier film 116 and the semiconductor substrate 104, and thereafter solidify. The degree of filleting can be manipulated by varying the thickness of the adhesive layers. Such filleting of the adhesive layers accords additional protection against the possibility of filler particles lodging or wedging between the adhesive layers and the semiconductor die 102 and/or the semiconductor substrate 104.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A semiconductor die assembly comprising:
   a semiconductor substrate having a first surface and a second surface, the semiconductor substrate including at least one opening extending therethrough between the semiconductor substrate first surface and the semiconductor substrate second surface;
   at least one semiconductor die having an active surface with at least one electrical connection area disposed on the semiconductor die active surface, the at least one semiconductor die oriented having the at least one electrical connection area substantially aligned with the at least one semiconductor substrate opening; and
   at least one piece of adhesive tape interposed between and attaching the semiconductor die active surface and the semiconductor substrate first surface, a width of the at least one piece of adhesive tape extending beyond at least one of an edge of the at least one semiconductor substrate opening and an edge of the at least one semiconductor die to provide a detectable surface of the at least one piece of adhesive tape.

2. The semiconductor die assembly of claim 1, further including at least one electrical connection extending between the at least one electrical connection area and at least one trace on the semiconductor substrate second surface.

3. The semiconductor die assembly of claim 2, wherein the at least one electrical connection comprises a bond wire.

4. The semiconductor die assembly of claim 2, wherein the at least one electrical connection comprises a TAB connection.

5. The semiconductor die assembly of claim 2, further including a glob top material disposed within the at least one semiconductor substrate opening encasing the at least one electrical connection.

6. The semiconductor die assembly of claim 5, further including an encapsulant material encasing the at least one semiconductor die and the glob top material.

7. The semiconductor die assembly of claim 1, wherein the at least one adhesive tape comprises a planar carrier film including a first surface having a first adhesive disposed thereon and a second surface having a second adhesive disposed thereon.

8. The semiconductor die assembly of claim 1, further comprising at least one fillet located proximate the at least one adhesive tape and the edge of the at least one semiconductor die.

9. The semiconductor die assembly of claim 1, further comprising at least one fillet located proximate the at least one adhesive tape and the edge of the at least one semiconductor substrate opening.

10. The semiconductor die assembly of claim 1, further comprising at least one fillet located proximate the at least one adhesive tape and the active surface of the at least one semiconductor die.

11. The semiconductor die assembly of claim 1, further comprising at least one fillet located proximate the at least one adhesive tape and the semiconductor substrate first surface.

12. A semiconductor die assembly comprising:
a semiconductor substrate having a first surface and a second surface, wherein the semiconductor substrate includes at least one opening defined therethrough between the semiconductor substrate first surface and the semiconductor substrate second surface;
at least one semiconductor die having an active surface with at least one electrical connection area disposed on the semiconductor die active surface, the at least one semiconductor die oriented having the at least one electrical connection area substantially aligned with the at least one semiconductor substrate opening, the electrical connection area disposed on the semiconductor die active surface, the at least one electrical connection area directly connected to at least one output electrical connection of the at least one semiconductor die; and
at least one adhesive tape interposed between and attaching the semiconductor die active surface and the semiconductor substrate first surface, a width of the at least one adhesive tape extending at least proximate an edge of the at least one semiconductor die to an edge of the at least one semiconductor substrate opening, the width of the at least one adhesive tape extends beyond the edge of the at least one semiconductor substrate opening a distance into the at least one semiconductor substrate opening to provide a detectable surface within the at least one semiconductor substrate opening.

13. A semiconductor die assembly comprising:
a semiconductor substrate having a first surface and a second surface, wherein the semiconductor substrate includes at least one opening defined therethrough between the semiconductor substrate first surface and the semiconductor substrate second surface;
at least one semiconductor die having an active surface with at least one electrical connection area disposed on the semiconductor die active surface, the at least one semiconductor die oriented having the at least one electrical connection area substantially aligned with the at least one semiconductor substrate opening, the at least one electrical connection area disposed on the semiconductor die active surface, the at least one electrical connection area directly connected to at least one output electrical connection of the at least one semiconductor die; and
at least one adhesive tape interposed between and attaching the semiconductor die active surface and the semiconductor substrate first surface, a width of the at least one adhesive tape extending at least proximate an edge of the at least one semiconductor die to an edge of the at least one semiconductor substrate opening and extending beyond the edge of the at least one semiconductor die a distance on the semiconductor substrate first surface to provide a detectable adhesive tape surface on the semiconductor substrate first surface.

14. A semiconductor die assembly comprising:
a semiconductor substrate having a first surface and a second surface, wherein the semiconductor substrate includes at least one opening defined therethrough between the semiconductor substrate first surface and the semiconductor substrate second surface;
at least one semiconductor die having an active surface with at least one electrical connection area disposed on the semiconductor die active surface, the at least one semiconductor die oriented having the at least one electrical connection area substantially aligned with the at least one semiconductor substrate opening; and
at least one adhesive tape interposed between and attaching the semiconductor die active surface and the semiconductor substrate first surface, a width of the at least one adhesive tape extends at least proximate an edge of the at least one semiconductor die to an edge of the at least one semiconductor substrate opening, the at least one adhesive tape comprises a planar carrier film including a first surface having a first adhesive disposed thereon and a second surface having a second adhesive disposed thereon, and the composition of the first adhesive differs from a composition of the second adhesive for substantially preventing damage to a portion of the active surface of the semiconductor die by filler particles in a material used to fill the at least one opening in the semiconductor substrate being located between the first surface of the semiconductor substrate and the active surface of the at least one semiconductor die.

15. A computer comprising:
at least one semiconductor die assembly, the semiconductor die assembly comprising:
a semiconductor substrate having a first surface and a second surface, wherein the semiconductor substrate includes at least one opening defined therethrough between the semiconductor substrate first surface and the semiconductor substrate second surface;
at least one semiconductor die having an active surface with at least one electrical connection area disposed on the semiconductor die active surface, the at least one semiconductor die oriented having the at least one electrical connection area substantially aligned with the at least one semiconductor substrate opening; and
at least one piece of adhesive tape interposed between and attaching the semiconductor die active surface and the semiconductor substrate first surface, a width of one piece of adhesive tape of the two pieces of adhesive tape extending at least one of at least to said a width of the at least one piece of adhesive tape extending beyond at least one of an edge of the at least one semiconductor substrate opening and an edge of the at least one semiconductor die to provide a detectable surface of the at least one piece of adhesive tape.

* * * * *